United States Patent
Imai et al.

(10) Patent No.: US 6,187,509 B1
(45) Date of Patent: Feb. 13, 2001

(54) POSITIVE TYPE ELECTRODEPOSITION PHOTORESIST COMPOSITIONS AND PATTERN FORMATION PROCESS

(75) Inventors: Genji Imai, Hiratsuka; Hideo Kogure, Atsugi; Takeya Hasegawa, Hiratsuka, all of (JP)

(73) Assignee: Kansai Paint Co., Ltd., Hyogo-ken (JP)

( * ) Notice: Under 35 U.S.C. 154(b), the term of this patent shall be extended for 0 days.

(21) Appl. No.: 09/167,564

(22) Filed: Oct. 7, 1998

(30) Foreign Application Priority Data

Oct. 7, 1997 (JP) .................................................. 9-289218

(51) Int. Cl.[7] ................................ G03F 7/31; G03F 7/32; G03F 7/38
(52) U.S. Cl. .................................... 430/284.1; 430/288.1; 430/18; 430/330; 430/326; 522/26; 204/478
(58) Field of Search ........................... 522/26; 430/270.1, 430/920, 288.1, 284.1, 18, 330, 326; 204/478

(56) References Cited

U.S. PATENT DOCUMENTS

| 4,371,605 | * | 2/1983 | Renner | 430/280.1 |
| 5,527,656 | | 6/1996 | Imai et al. | 430/288.1 |
| 5,846,688 | * | 12/1998 | Fukui et al. | 430/270.1 |

FOREIGN PATENT DOCUMENTS

| 0 609 684 A1 | * | 8/1994 | (EP) . |
| 6-313134 | | 11/1994 | (JP) . |
| 6-313135 | | 11/1994 | (JP) . |
| 6-313136 | | 11/1994 | (JP) . |

* cited by examiner

*Primary Examiner*—Cynthia Hamilton
(74) *Attorney, Agent, or Firm*—Wenderoth, Lind & Ponack, L.L.P.

(57) ABSTRACT

A positive type electrodeposition photoresist composition characterized by neutralizing by a basic compound and dissolving or dispersing in an aqueous medium a composition comprising (A) a polymer having 0.5–10 equivalents of carboxyl group(s) and optionally having more than 1 equivalent of hydroxyphenyl group(s) per kg polymer, or (A') a polymer having 0.5–10 equivalents of carboxyl group(s) per kg polymer and (A") a polymer having more than 1 equivalent of hydroxyphenyl group(s) per kg polymer; (B) a compound having at least two vinyl ether groups per molecule; (C) a compound which generates an acid when irradiated with a visible light; and (D) a sensitizing dye, and a process for pattern formation using such a composition are disclosed.

Said composition has excellent thermal stability, high resolution and formability of fine image pattern and is useful to positive type photoresist, printing material etc.

28 Claims, No Drawings

POSITIVE TYPE ELECTRODEPOSITION PHOTORESIST COMPOSITIONS AND PATTERN FORMATION PROCESS

BACKGROUND OF THE INVENTION

1. Field of the Invention

The present invention relates to positive type electrodeposition photoresist compositions, as well as to formation processes, using the compositions, for pattern useful to circuit formation of electronic devices, materials for printing etc.

2. Description of the Prior Art

Currently, positive type photoresists are widely used for formation of circuit patterns of electronic devices etc. As positive type aqueous resist compositions used for these applications, in many cases, resins, which dissolve or disperse in water by neutralization and chemically bound with a quinone diazide compound, are used in the form of aqueous solution or dispersion.

These compositions form a resist film by utilizing a reaction in which the quinone diazide group is photodecomposed when irradiated with an ultraviolet light and forms an indenecarboxylic acid via a ketene.

The resist compositions using quinone diazide compound, however, are weakly photoreactive to a visible light and hence, there are problems of insufficient resolution etc. in case a formation of a very fine pattern is necessary. Moreover, the quinone diazide group is unstable in aqueous systems, and hence, there is a difficulty in using the composition containing a quinone diazide group in applications that require prolonged stability of the composition in a bath as in the electrodeposition coating process.

The present inventors previously proposed, as positive type electrodeposition photoresist compositions replacing these, a composition sensitive also to a visible light comprising a polymer having carboxyl group(s) and occasionally phenolic hydroxyl group(s), a compound having a plurarity of vinyl ether groups, and a compound which is decomposed and generates an acid when irradiated with an actinic ray (U.S. Pat. No. 5,527,656; Japanese Laid-open Patent Publications No. 313134/1994, 313135/1994, and 313136/1994. These compositions are photosensitive electrodeposition compositions which function according to a mechanism that the film formed from them becomes insoluble in solvents and aqueous alkaline solutions through crosslinking by an addition reaction between carboxyl group(s) and vinyl ether group(s) when heated, and when it is further irradiated with an actinic ray and then heated, the exposed portions become soluble in solvents and aqueous alkaline solutions again as the crosslinked structure is severed by the catalytic action of the acid generated by the irradiation.

These compositions have advantages such as having high transparency to actinic rays, because they need not contain a large amount of a functional group of high extinction coefficient unlike resists using quinone diazide as a photosensitizer and having high sensitivity as positive type photosensitive composition because the acid generated at the exposed portions acts as catalyst, when heated, to sever the crosslinked structure in the form of a chain reaction.

However, the heating time is required to be shortened in respect of productivity, when these photosensitive electrodeposition compositions are coated on a substrate and heated for crosslinking. When a shortening of the time is tried by heating at a higher temperature than 100° C., there is the problem that the compound, which generates an acid when irradiated with an actinic ray, existing in said photosensitive electrodeposition composition, generates an acid already before being irradiated by a visible light and thus the whole formed film is dissolved when developed. Therefore, an improvement of the thermal stability of said photosensitive electrodeposition composition is strongly demanded in said technical field.

SUMMARY OF THE INVENTION

The present inventors made an intensive study to solve problems the above-mentioned photosensitive electrodeposition compositions have. As a result, they have found that the above-mentioned problems can be solved by using naphthalimidylsulphonate, as the compound which is decomposed and generates an acid when irradiated with a visible light, in combination with a sensitizing dye and completed the present invention.

Thus, according to an aspect of the present invention, there is provided a positive type electrodeposition photoresist composition characterized by neutralizing by a basic compound and dissolving or dispersing in an aqueous medium a composition comprising (A) a polymer having 0.5–10 equivalents of carboxyl group(s) and optionally having more than 1 equivalent of hydroxy-phenyl group(s) per kg polymer; (B) a compound having at least two vinyl ether groups per molecule; (C) a compound, which generates an acid when irradiated with a visible light, represented by the general formula wherein R represents

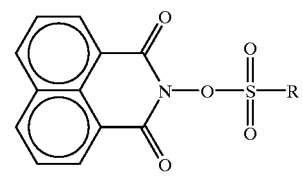

(1)

wherein R represent

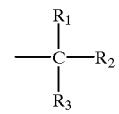

group (where $R_1$, $R_2$ and $R_3$ each independently represents hydrogen atom or fluorine atom),

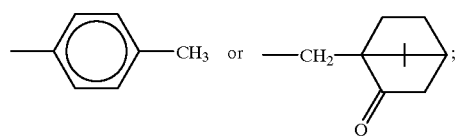

and (D) a sensitizing dye;
as well as a process for pattern formation using such a composition.

Furthermore, according to another aspect of the present invention, there is provided a positive type electrodeposition photoresist composition characterized by neutralizing by a basic compound and dissolving or dispersing in an aqueous medium a composition comprising (A') a polymer having 0.5–10 equivalents of carboxyl group(s) per kg polymer; (A") a polymer having more than 1 equivalent of hydroxyphenyl group(s) per kg polymer;

(B) a compound having at least two vinyl ether groups per molecule; (C) a compound, which generates an acid when irradiated with a visible light, represented by the above-mentioned general formula (I); and (D) a sensitizing dye; as well as a process for pattern formation using such a composition.

The compositions of the present invention are highly sensitive to a visible light, especially to Ar laser having stable emission of radiation in a visible area of wavelength 488 nm or 514.5 nm, have even no problem of film dissolution during development in the pattern formation procedure due to a high thermal stability, have an excellent contrast of the formed pattern, and are useful for such applications as positive type photoresist, printing materials etc.

DETAILED DESCRIPTION OF THE INVENTION

The present invention is hereinafter described in more detail.

(A) Polymer having Carboxyl Group(s) and Optionally having Hydroxyphenyl Group(s)

The polymer (A) used in the positive type electrodeposition photoresist composition according to the first aspect of the present invention is a film-forming polymer having at least one carboxyl group per molecule and optionally having hydroxyphenyl group(s). The polymers having only carboxyl group(s) include, for example, homopolymers of a carboxyl group-containing polymerizable unsaturated monomer; copolymers of said carboxyl group-containing monomer and another monomer copolymerizable therewith; a resin of polyester type, polyurethane type, polyamide type or other types having carboxyl group(s) in the molecular chain or at the molecular end(s). The polymers having both carboxyl group(s) and hydroxyphenyl group(s) include, for example, copolymers of a hydroxystyrene such as p-hydroxystyrene and a carboxyl group-containing polymerizable unsaturated monomer; copolymers of a hydroxystyrene and said carboxyl group-containing monomer, and another copolymerizable monomer and the like.

The above-mentioned carboxyl group-containing polymerizable unsaturated monomers include, for example, acrylic acid, methacrylic acid, crotonic acid, itaconic acid etc. The other monomers copolymerizable with these carboxyl group-containing polymerizable unsaturated monomers and/or a hydroxystyrene include, for example, $C_1$–$C_{12}$ alkyl esters of (meth)acrylic acid, such as methyl (meth)acrylate, ethyl (meth)acrylate, propyl (meth)acrylate, butyl (meth)acrylate, hexyl (meth)acrylate, octyl (meth)acrylate, 2-ethylhexyl (meth)acrylate, nonyl (meth)acrylate, decyl (meth)acrylate and the like; $C_2$–$C_6$ hydroxyalkyl esters of (meth)acrylic acid, such as hydroxyethyl (meth)acrylate, 2-hydroxypropyl (meth)acrylate, 3-hydroxypropyl (meth) acrylate, hydroxybutyl (meth)acrylate and the like; aromatic vinyl compounds such as styrene, α-methylstyrene, p-tert-butylstyrene and the like; vinyl acetate, (meth)acrylonitrile, (meth)acrylamide and vinylpyrrolidone etc. These monomers can be used individually or in combination of two or more.

Moreover, as polymers (A), there may be used polymers obtained by condensation of formaldehyde with a phenol carboxylic acid such as hydroxybenzoic acid, gallic acid, resorcylic acid etc., or mixture of them with one or more than two phenols selected from phenol, $C_1$–$C_{18}$ mono- or dialkylphenol or naphthol, resorcinol, catechol, etc.

The polymer (A) preferably has a number-average molecular weight in a range of generally about 500 to about 100,000, particularly about 1,000 to about 50,000 and more particularly about 1,500 to 30,000. The desirable carboxyl group content is in a range of generally 0.5 to 10 equivalents, particularly 0.5 to 8 equivalents, and more particularly 0.5 to 5 equivalents per kg of the polymer and the desirable hydroxyphenyl group content, when exists, is at least 1 equivalent and in a range of generally 1 to 10 equivalents, particularly 2 to 8 equivalents, and more particularly 3 to 6 equivalents per kg of the polymer. When the carboxyl group content is less than 0.5 equivalents/kg, the film formed by heating before irradiation with a visible light has no sufficient crosslinking degree, and the developability tends to decrease due to low solubility of the exposed portions in alkaline developer. On the other hand, when the carboxyl group content is more than 10 equivalents/kg, the storing stability of the composition tends to decrease. When the hydroxyphenyl group content is less than 1 equivalent/kg, the crosslinking degree at the crosslinking may not be sufficient.

Further, the polymer (A) preferably has a glass transition temperature (Tg) of not lower than 0° C., particularly in a range of 5 to 70° C. When Tg is lower than 0° C., the resulting coating film is sticky and easily picks up dirt and dust, there being the possibility that the handling becomes difficult.

(A') Polymer having Carboxyl Group(s)

The polymer (A') used in the positive type electrodeposition photoresist compositions according to the second aspect of the present invention is a film-formable polymer having at least one carboxyl group in the molecule and includes, for example, a homopolymer of a carboxyl group-containing polymerizable unsaturated monomer; a copolymer of said carboxyl group-containing monomer and other copolymerizable monomer; and a resin of polyester type, polyurethane type, polyamide type or other types having carboxyl group(s) in the molecular chain or at the molecular end(s).

The above-mentioned carboxyl group-containing polymerizable unsaturated monomers include, for example, acrylic acid, methacrylic acid, crotonic acid, itaconic acid etc. The other monomers copolymerizable with these carboxyl group-containing monomers include, for example, $C_1$–$C_{12}$ alkyl esters of (meth)acrylic acid, such as methyl (meth)acrylate, ethyl (meth)acrylate, propyl (meth)acrylate, butyl (meth)acrylate, hexyl (meth)acrylate, octyl (meth) acrylate, 2-ethylhexyl (meth)acrylate, nonyl (meth)acrylate, decyl (meth)acrylate and the like; $C_2$–$C_6$ hydroxyalkyl esters of (meth)acrylic acid, such as hydroxyethyl (meth) acrylate, 2-hydroxypropyl (meth)acrylate, 3-hydroxypropyl (meth)acrylate, hydroxybutyl (meth)acrylate and the like; aromatic vinyl compounds such as styrene, α-methylstyrene, p-tert-butylstyrene and the like; vinyl acetate, (meth)acrylonitrile, (meth)acrylamide, vinylpyrrolidone etc. These monomers can be used individually or in combination of two or more. Among said other monomers, preferable are aromatic vinyl compounds such as styrene, α-methylstyrene, $C_1$–$C_6$ alkyl-substituted styrene (for example, p-tert-butylstyrene) and the like, in view of the precision of formed image patterns, etching resistance, etc.

The carboxyl group-containing polymer (A') preferably has a number-average molecular weight in a range of generally about 3,000 to about 100,000, particularly about 4,000 to about 65,000 and more particularly about 5,000 to 30,000. The desirable carboxyl group content is in a range of generally 0.5 to 10 equivalents, particularly 0.5 to 8 equivalents, and more particularly 0.5 to 5 equivalents per kg of the polymer. When the carboxyl group content is less than 0.5 equivalents/kg, the film formed by heating before irradiation with a visible light has no sufficient crosslinking degree, and the developability tends to decrease due to low solubility of the exposed portions in alkaline developer. On the other hand, when the carboxyl group content is more than 10 equivalents/kg, the storing stability of the composition tends to decrease.

Further, the polymer (A') preferably has a glass transition temperature (Tg) of not lower than 0° C., particularly in a range of 5 to 70° C. When Tg is lower than 0° C., the resulting coating film is sticky and easily picks up dirt and dust, there being the possibility that the handling becomes difficult.

(A") Polymer having Hydroxyphenyl Group(s)

The polymer (A") used in combination with the above-mentioned polymer (A') in the positive type electrodeposition photoresist compositions according to the second aspect of the present invention is a polymer having at least one hydroxyphenyl group in the molecule and includes, for example, a condensation product of a monofunctional or polyfunctional phenol compound, an alkylphenol compound or their mixture, and a carbonyl compound such as formaldehyde, acetone or the like; a homopolymer of a hydroxy group-containing aromatic vinyl compound such as p-hydroxystyrene or the like; and a copolymer of said hydroxyl group-containing aromatic vinyl compound with other copolymerizable monomer.

The above-mentioned monofunctional or polyfunctional phenol compounds include, for example, compounds having 1–3 hydroxyl groups on the benzene ring, such as phenol, o-cresol, m-cresol, p-cresol, 3,5-xylenol, 2,6-xylenol, 2,4-xylenol, catechol, resorcinol, pyrogallol, bisphenol A and the like. The alkylphenol compounds include, for example, alkylphenol compounds whose alkyl moiety has 1–10 carbon atoms, preferably 1–4 carbon atoms, such as p-isopropylphenol, p-tert-butylphenol, p-tert-amylphenol, p-tert-octylphenol and the like.

The condensation reaction between these compounds and the carbonyl compound such as formaldehyde, acetone or the like can be conducted by a per se known method. In general, condensation in the presence of an alkali catalyst gives an insoluble and infusible resole type resin with the progress of condensation; and condensation using an acid catalyst gives a soluble and fusible novolac type resin. In the present invention, the latter novolac type phenolic resin may usually be used. While novolac type phenolic resins increase the molecular weight with the progress of condensation, a novolac type phenolic resin having a molecular weight in a range of 500 to 2,000, particularly 700 to 1,500, is obtained generally by conducting condensation for 1–3 hours.

As other monomers copolymerizable with the hydroxy group-containing aromatic vinyl compound, there can be used the same other copolymerizable monomers as mentioned with respect to the copolymer used in the above-mentioned polymer (A').

This hydroxyphenyl group-containing polymer (A") preferably has a number-average molecular weight in a range of generally about 500 to about 100,000, particularly about 750 to about 65,000, and more particularly about 1,000 to about 30,000.

The preferable hydroxyphenyl group content in the polymer (A") is more than 1 equivalent and in a range of generally 1 to 10 equivalents, particularly 2 to 8 equivalents, and more particularly 3 to 6 equivalents, per kg of the polymer. When the hydroxyphenyl group content is less than 1 equivalent/kg, the film formed by heating before irradiation with a visible light tends to have insufficient crosslinking degree.

The polymer (A"), similarly to the polymers (A) and (A'), preferably has a glass transition temperature (Tg) of not lower than 0° C., particularly in a range of 5 to 70° C. When Tg is lower than 0° C., the resulting coating film is sticky and easily picks up dirt and dust, there being the possibility that the handling becomes difficult.

(B) Compound having at Least two Vinyl Ether Groups in the Molecule

The compound (B) is a low-molecular weight or high-molecular weight compound having, in a molecule, at least two, preferably two to four vinyl ether groups represented by a formula —R'—O—CH=CH$_2$ [wherein R' represents a $C_1$–$C_6$ straight chain or branched chain alkylene group, such as ethylene, propylene, butylene or the like] and includes, for example, condensation products between a polyphenol compound such as bisphenol A, bisphenol F, bisphenol S, phenolic resin etc. or a polyol such as ethylene glycol, propylene glycol, tri-methylolpropane, trimethylolethane, pentaerythritol etc. and a halogenated alkyl vinyl ether such as chloroethyl vinyl ether etc.; reaction products between a polyisocyanate such as tolylene diisocyanate, xylylene diisocyanate, hexamethylene diisocyanate, isophorone diisocyanate etc. and a hydroxyalkyl vinyl ether such as hydroxyethyl vinyl ether. Among these, the above-mentioned condensation products between a polyphenol compound and a halogenated alkyl vinyl ether, and reaction products between a polyisocyanate compound having an aromatic ring and a hydroxyalkyl vinyl ether are preferable in view of etching resistance, precision of the formed pattern etc.

Preferably, the compound (B) is a liquid at normal temperature, or has a melting or softening point of lower than 150° C., particularly lower than 130° C. The reason is that such a compound (B) can easily migrate into the polymer (A) or the polymers (A') and/or (A") at the heating step before irradiation with a visible light and the carboxyl group(s) and/or the phenolic hydroxyl group(s) in the polymer (A) or the polymers (A') and/or (A") can easily give rise to an addition reaction with the vinyl ether groups in the compound (B).

(C) Compound which Generates an Acid when Irradiated with a Visible Light

The compound (C) is a compound which, when irradiated with a visible light to be described later, is decomposed and generates an acid having an intensity sufficient to sever the crosslinked structure formed between the above-mentioned polymer (A) or polymers (A') and/or (A") and the compound (B). [Hereinafter, the compound (C) is referred to as "photochemically-acid-generating compound" in some cases.] The compound (C) includes, for example, the compounds represented by the following general formula (I).

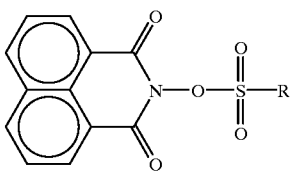
(I)

wherein R represents

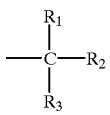

group (where $R_1$, $R_2$ and $R_3$ each independently represents hydrogen atom or fluorine atom),

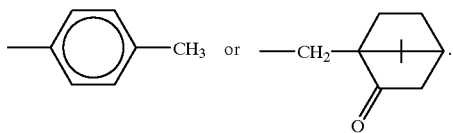

Specific examples of the compounds represented by the above-mentioned formula (I) include, for example,

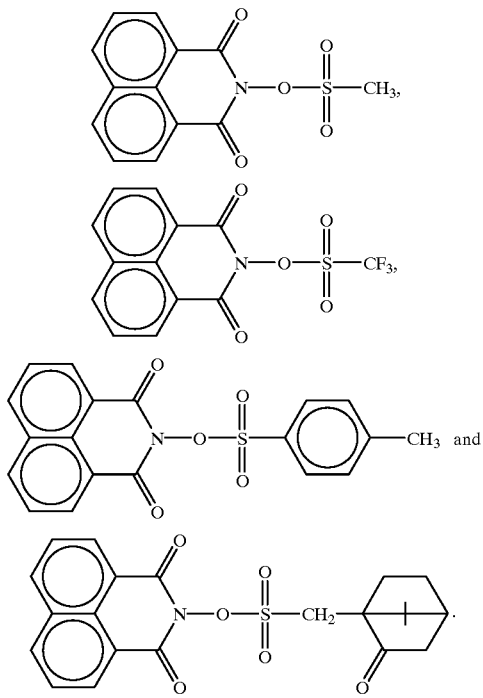

(D) Sensitizing Dye

The sensitizing dye (D) used in the positive type electrodeposition photoresist compositions of the present invention is a compound which is excited by absorbing the light of the wavelength range of 400 to 700 nm (visible light) and has a mutual action with the above-mentioned polymers (A), (A'), (A"), the compound (B) and/or the photochemically-acid-generating compound (C). Examples of the sensitizing dye (D) include the compounds represented by the following general formulae (II) and (III), cyanine type dyes, merocyanine type dyes, coumalin type dyes and the like. Among these, particularly the compounds represented by the general formulae (II) and (III) are preferable. The "mutual action" mentioned here includes energy transfer and electron transfer from the excited sensitizing dye to the other components.

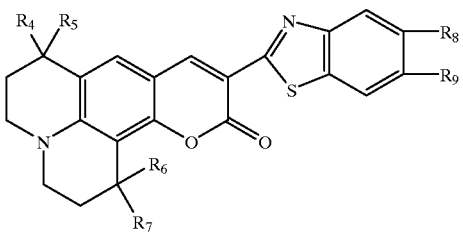
(II)

wherein $R_4$, $R_5$, $R_6$ and $R_7$ each independently represents methyl, ethyl, propyl or isopropyl groups, preferably methyl group, and $R_8$ and $R_9$ each independently represents hydrogen atom, alkyl group of 1–4 carbon atoms, alkoxy group of 1–4 carbon atoms, alkoxycarbonyl group of 2–5 carbon atoms, dialkylamino group of 1–4 carbon atoms in each alkyl moiety, Cl, Br, CN, $NO_2$ or $SO_2CH_3$, and preferably hydrogen or methyl group.

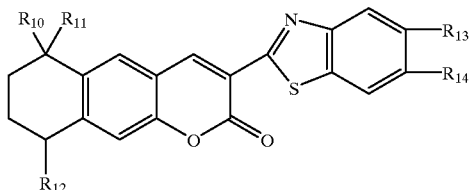
(III)

wherein $R_{10}$, $R_{11}$ and $R_{12}$ each independently represents methyl, ethyl, propyl or isopropyl groups, preferably $R_{10}$ and $R_{11}$ being methyl group and $R_{12}$ being ethyl group, and $R_{13}$ and $R_{14}$ each independently represents hydrogen atom, alkyl group of 1–4 carbon atoms, alkoxy group of 1–4 carbon atoms, alkoxycarbonyl group of 2–5 carbon atoms, dialkylamino group of 1–4 carbon atoms in each alkyl moiety, Cl, Br, CN, $NO_2$ or $SO_2CH_3$, and preferably hydrogen or methyl group.

Besides the compounds represented by the above-mentioned (II) and (III), as cyanine type dyes, merocyanine type dyes and coumalin type dyes per se known ones can be used. For example, as cyanine type dyes and merocyanine type dyes, what is described in Japanese Laid-open Patent Publication No. 213838/1986, and as coumalin type dyes what is described in Japanese Laid open Patent Publications No. 97650/1986 and No. 223759/1991 can be mentioned.

Positive Type Electrodeposition Photoresist Composition

The positive type electrodeposition photoresist composition according to the first aspect of the present invention comprises, as essential components, four components, i.e., the above-mentioned polymer having carboxyl group(s) and optionally having hydroxyphenyl group(s) (A), compound having vinyl ether groups (B), photochemically-acid-generating compound (C) and sensitizing dye (D) and is dissolved or dispersed in an aqueous medium, while the carboxyl groups in said polymer (A) being neutralized by a basic compound. The compounding ratio of these components can be varied over a wide range depending upon the applications of said composition etc. However, the compound having vinyl ether groups (B) is preferably used in a range of generally 0.1–150 parts by weight, particularly 1–100 parts by weight, and more particularly 3–80 parts by weight, per 100 parts by weight of the polymer (A). The photochemically-acid-generating compound (C) is appropriately used in a range of generally 0.1–40 parts by weight, particularly 0.2–20 parts by weight, and more particularly 0.5–15 parts by weight, per 100 parts by weight of the total of the polymer (A) and the compound having vinyl ether groups (B). Furthermore, the sensitizing dye (D) can be used in a range of generally 0.1–10 parts by weight, preferably 0.5–5 parts by weight, and more preferably 0.5–3 parts by weight, per 100 parts by weight of the total of the polymer (A) and the compound having vinyl ether groups (B).

The positive type electrodeposition photoresist composition according to the second aspect of the present invention comprises, as essential components, five components, i.e., the above-mentioned carboxyl group-containing polymer (A'), hydroxyphenyl group-containing polymer (A"), compound having vinyl ether groups (B), photochemically-acid-generating compound (C) and sensitizing dye (D) and is dissolved or dispersed in an aqueous medium, while the carboxyl groups in said polymer (A') being neutralized by a basic compound. The compounding ratio of these components can be varied over a wide range depending upon the applications of said composition etc. However, the carboxyl group-containing polymer (A') and hydroxyphenyl group-containing polymer (A") may be used in a range of proportions by weight, (A')/(A"), of generally 90/10 to 10/90, particularly 70/30 to 30/70, and more particularly 60/40 to 40/60. The compound having vinyl ether groups (B) is preferably used in a range of generally 5–150 parts by weight, particularly 10–100 parts by weight, and more particularly 10–80 parts by weight, per 100 parts by weight of the total of the carboxyl group-containing polymer (A'), and hydroxyphenyl group-containing polymer (A"). The photochemically-acid-generating compound (C) is appropriately used in a range of generally 0.1–40 parts by weight, particularly 0.2–20 parts by weight, and more particularly 0.5–15 parts by weight, per 100 parts by weight of the total of the carboxyl group-containing polymer (A'), hydroxyphenyl group-containing polymer (A"), and the compound having vinyl ether groups (B). Furthermore, the sensitizing dye (D) can be used in a range of generally 0.1–10 parts by weight, preferably 0.5–5 parts by weight, and more preferably 0.5–3 parts by weight, per 100 parts by weight of the total of the carboxyl group-containing polymer (A'), hydroxyphenyl group-containing polymer (A"), and the compound having vinyl ether groups (B).

In the compositions of the present invention, existence of water is preferable in order to smoothly progress the acid hydrolysis reaction, which takes place in the exposed portions by the acid generated when the resulting film is exposed to light. Therefore, the compositions of the present invention may comprise a hydrophilic resin such as polyethylene glycol, polypropylene glycol, methyl cellulose, ethyl cellulose etc., so that necessary amount of water for the above-mentioned reaction be taken into the resulting film. The amount of such hydrophilic resin to be added can be usually in a range of generally less than 20 parts by weight, preferably 0.1–10 parts by weight, and more preferably 0.1–5 parts by weight, per 100 parts by weight of the total of the components (A), (B), (C) and (D), or per 100 parts by weight of the total of the components (A'), (A"), (B), (C) and (D).

The compositions of the present invention may also comprise a plasticizer such as phthalic acid ester etc., a polyester resin, an acrylic resin etc. in order to allow the film formed by using the compositions of the present invention to have appropriate flexibility, non-tackiness, etc. The preferable amounts of these additives are usually less than 50 parts by weight, particularly 0.1 to 30 parts by weight, per 100 parts by weight of the total of the components (A), (B), (C) and (D), or per 100 parts by weight of the total of the components (A'), (A"), (B), (C) and (D).

The compositions of the present invention may furthermore comprise a fluidity-controlling agent, a colorant such as dye or pigment, etc. as necessary.

The positive type electrodeposition photoresist composition of the present invention can be prepared by mixing the above-mentioned components alone or in a solvent, as necessary, then neutralizing with a basic compound and dissolving or dispersing in an aqueous medium. The usable solvent preferably dissolves each component of the composition and is dissolved in water to more than 10% by weight at normal temperature, and can include, for example, ketones such as acetone, methyl ethyl ketone and the like; aliphatic alcohols of 1–10 carbon numbers such as methanol, ethanol, propanol and the like; glycols such as ethylene glycol, propyleneglycol and the like; glycol ethers such as mono- or diethers of these glycols with methanol, ethanol, butanol etc., or esters of said monoethers; cyclic ethers such as dioxane, tetrahydrofuran and the like. These solvents can be used individually or in admixture of two or more, as necessary.

These solvents are preferably used in an amount of usually no more than 60 parts by weight, particularly no more than 40 parts by weight, per 100 parts by weight of the total of the polymer having carboxyl group(s) and optionally having hydroxyphenyl group(s) (A), compound having vinyl ether groups (B), photochemically-acid-generating compound (C) and sensitizing dye (D), or per 100 parts by weight of the total of the polymer (A'), the polymer (A"), the compound (B), the compound (C) and the dye (D).

Further, there can auxiliarily be used solvents having a solubility in water of not exceeding 10% by weight at normal temperature in order to adjust the voltage to be applied and film-formability at the time of electrodeposition coating which will be described later on.

Examples of such a solvent include ketones such as methyl isobutyl ketone, cyclohexanone, isophorone etc.; alcohols such as n-butanol, hexanol, octanol, benzyl alcohol etc.; glycols such as ethylene glycol, propylene glycol etc.; glycol ethers such as monoether between such a glycol and hexanol, octanol, phenol etc. or diether between such a glycol and hexanol, octanol, phenol etc.; aromatic hydrocarbons such as toluene, xylene, alkylbenbenes etc.; and aliphatic hydrocarbons having a boiling point of not lower than 80° C. These solvents can be used individually or in mixing two or more.

The basic compound used in the neutralization includes, for example, amines such as trimethylamine, triethylamine, diethylamine, dimethylethanolamine, diethanolamine, methyldiethanolamine, triethanolamine, 2-aminomethylpropanol, benzylamine etc.; inorganic alkalis such as sodium hydroxide, potassium hydroxide etc.; ammonia etc. These basic compounds may be used individually or in mixing two or more. These basic compounds are preferably used in a range of 0.1–1 equivalents, particularly 0.2–0.7 equivalents per carboxyl group.

The composition of the present invention can be prepared by a per se known method as by gradually adding to an aqueous medium, while stirring, a mixture of the components such as the polymer (A), or the polymers (A') and (A"), the compound having vinyl ether groups (B), the photochemically-acid-generating compound (C), the sensitizing dye (D), the basic compounds used for neutralization, and, as necessary, the above-described solvent, etc. The solid content of the resulting compositions is not particularly limited but, usually it is preferably in a range of 0.5–50% by weight, particularly 5–20% by weight.

Formation of Pattern

Pattern formation using the positive type electrodeposition photoresist composition of the present invention can be conducted, for example, as described below.

First, said composition is coated on a substrate having an electroconductive surface, for example, a copper-laminated substrate for printed circuit or the like by electrodeposition coating to a thickness of about 0.5–15 μm in terms of dry-film thickness. The electrodeposition coating is conducted by dipping an article to be coated as an anode in an electrodeposition bath comprising the composition of the present invention, connecting a direct current source between the anode and the cathode, and applying current. Application of current can be conducted by a constant voltage method in which a constant voltage is applied, a constant current method in which current is applied at a constant current density or a combination method in which they are combined. Also, a method may be used in combination in which the voltage or current density is increased slowly at an initial stage to a predetermined value.

The resist film having the predetermined film thickness can be formed by applying a voltage of usually 5–250V for 10 seconds to 5 minutes in the case of the constant voltage method or applying a current density of usually 5–100 mA/dm$^2$ for 5 seconds to 5 minutes in the case of the constant current method.

The thickness of the coating film of the composition of the present invention by electrodeposition coating is not restricted strictly and can be varied depending on the intended application of the formed pattern. However, the appropriate film thickness is usually in a range of about 0.5–15 μm, particularly about 1–10 μm, in term as of dry-film thickness.

The substrate coated with the composition of the present invention is heated to crosslink and harden the coating film under the conditions of temperature and time, under which a crosslinking reaction substantially occurs between the polymer (A) or polymers (A') and/or (A"), and vinyl ether group-containing compound (B), for example, at about 60° C. to about 150° C., preferably at about 80° C. to about 140° C., for about 1 to about 30 minutes.

Then, the cured coating film on the substrate is irradiated image-selectively with a visible light, using a positive type photomask, a reduction projection aligner, a direct drawing machine or the like. The visible light usable here is selected depending upon the kind of the photochemically-acid-generating compound (C) and the sensitizing dye (D) etc. blended in the composition of the present invention and can include, for example, monochromic rays in a visible area of the wavelength 400 to 600 nm or mixed rays thereof, or Ar laser with an emission of radiation in a visible region.

The substrate irradiated with a visible light is then heated under the conditions of temperature and time, under which the crosslinked structure of the above-mentioned cured coating film is severed in the presence of the acid generated by said irradiation, for example, at about 60 to about 150° C., preferably at about 80 to about 140° C., for about 1 to about 30 minutes, whereby the crosslinked structure of the irradiated portions of the coating film is substantially severed. Preferably in that case, the substrate irradiated with a visible light is previously contacted with water. By contacting with water the acid generates easily and the next severing reaction of the crosslinked structure becomes easier. Contact with water can be conducted by dipping the substrate in water of normal temperature or in warm water, or by blowing water vapor on the substrate.

The thus treated substrate after heating-irradiation-contact with water as necessary-heating is treated with a developer, whereby a pattern can be formed on the substrate. As the developer, there can be used a liquid capable of dissolving the polymer (A) or the polymers (A') and (A"), for example, an aqueous solution of a water-soluble organic base, for example, alkanolamine, hydroxyammonium salts such as tetraethylammonium hydroxide etc. or an inorganic alkali, for example, sodium hydroxide, sodium carbonate, sodium metasilicate etc.

These basic substances can be used individually or as a mixture of two or more. The preferable concentration of these substances is usually in a range of 0.05 to 10% by weight, particularly 0.1 to 8% by weight. Moreover, as necessary, solvents described as usable solvents in case of producing the positive type electrodeposition photoresist composition of the present invention may be added at the concentration within a mixable range with said developer.

The development can be conducted by a per se known method, for example, by dipping the substrate in the developer, or by spraying the developer onto the substrate. The substrate, on which a pattern has been formed, can be as necessary water-washed and/or heated for drying.

When the substrate is an etchable type, the exposed portions of the substrate may be removed with an appropriate etchant and, as necessary, the remaining coating film may be removed with an appropriate releasant to obtain a relief image.

The pattern thus formed is very fine and has excellent contrast, and accordingly can be advantageously used in the production of printing plate requiring a fine image, relief, display, printed circuit board etc.

Especially, as the positive type electrodeposition photoresist composition of the present invention has an excellent thermal stability in case of heating for crosslinking, it is possible to crosslink by a short heating at a high temperature of over 100° C. And as non-exposed portions of the resist film have a crosslinked structure, the non-exposed portions are more resistant against developer and etchant compared with a conventional positive type photoresist. Therefore, the formed pattern has an excellent precision and accordingly a wide range of applications are expected in the field of semiconductor fine processing such as printed circuit board of fine pattern, LSI etc., metal fine processing etc.

The present invention is hereinafter described more specifically by way of Examples. In the Examples, "part(s)" and "%" are by weight.

SYNTHESIS EXAMPLE 1

Synthesis of Polymer A-1 having Carboxyl Groups and Hydroxyphenyl Groups

Into a flask were placed 600 parts of o-hydroxy-benzoic acid, 900 parts of o-cresol, 1,1145 parts of 30% formalin, 130 parts of deionized water and 6.5 parts of oxalic acid. The mixture was refluxed by heating for 60 minutes. Thereto was added 13.5 parts of 15% hydrochloric acid and the mixture was refluxed by heating for 40 minutes. Then, thereto was added 400 parts of deionized water of about 15° C. The contents in the flask were kept at about 50° C. to precipitate a resin. Thereto was added 400 parts of deionized water to wash the resin at 50° C. The aqueous layer was removed. The washing operation was repeated three times. The resulting resin was dried at about 120° C. under reduced pressure to obtain a novolac phenolic resin (polymer A-1). Molecular weight=about 650; carboxyl group content=2.8 equivalents/kg of polymer; hydroxyphenyl group content=5.4 equivalents/kg of polymer.

SYNTHESIS EXAMPLE 2

Synthesis of Polymer A-2 having Carboxyl Groups and Hydroxyphenyl Groups

Into a flask were placed 200 parts of tetrahy-drofuran, 65 parts of p-hydroxystyrene, 28 parts of n-butyl acrylate, 11 parts of acrylic acid and 3 parts of azobisisobutyronitrile. The gas inside the flask was replaced by nitrogen, after which the Flask contents were heated at 100° C. for 2 hours with stirring. The reaction mixture was poured into 1,500 ml of toluene. The resulting precipitate was separated and dissolved in 300 ml of acetone. The solution was poured into 1,500 ml of toluene again. The resulting precipitate was dried at 60° C. under reduced pressure to obtain a polymer A-2. Molecular weight=about 5,200; acrylic acid/n-butyl acrylate/p-hydroxystyrene=17/37/50 (weight ratio); carboxyl group content=1.8 equivalents/kg of polymer; hydroxyphenyl group content=4.6 equivalents/kg of polymer.

SYNTHESIS EXAMPLE 3

Synthesis of Polymer A-3 having Carboxyl Groups and Hydroxyphenyl Groups

Into a flask were placed 200 parts of tetrahydrofuran, 93.5 parts of p-hydroxystyrene, 6.5 parts of acrylic acid and 3 parts of azobisisobutyronitrile. The gas inside the flask was replaced by nitrogen and the flask contents were heated at 100° C. for 2 hours with stirring. The reaction mixture was poured into 1,500 ml of toluene. The resulting precipitate was separated and dissolved in 300 ml of acetone. The solution was poured into 1,500 ml of toluene again. The resulting precipitate was dried at 60° C. under reduced pressure to obtain a polymer A-3. Molecular weight=about 2,300; carboxyl group content=1.0 equivalent/kg of polymer; hydroxyphenyl group content=7.0 equivalents/kg of polymer.

SYNTHESIS EXAMPLE 4

Synthesis of Polymer A-4 having Carboxyl Groups

| acrylic acid | 216 parts |
| styrene | 500 parts |
| n-butyl methacrylate | 284 parts |
| azobisisobutyronitrile (AIBN) | 50 parts | was dropwise added, in 2 hours, to 600 parts of methyl isobutyl ketone being stirred at 80° C. Fhe mixture was kept at that temperature for 2 hours to obtain a polymer A-4. Solid content=about 62.5%; carboxyl group content=3 equivalents/kg of polymer; aromatic ring content=34.6 parts by weight/100 parts by weight of polymer.

SYNTHESIS EXAMPLE 5

Synthesis of Polymer A-5 having Carboxyl Groups

| acrylic acid | 288 parts |
| styrene | 300 parts |
| n-butyl acrylate | 255 parts |
| 2-hydroxyethyl acrylate | 157 parts |
| tert-butyl peroxybenzoate | 100 parts | was dropwise added, in 2 hours, to 1,000 parts of 2-bu-toxyethanol being stirred at 110° C. The mixture was kept at that temperature for 2 hours to obtain a polymer A-5. Solid content=about 50%; carboxyl group content=4 equivalents/kg of polymer; aromatic ring content=20.7 parts by weight/100 parts by weight of polymer.

SYNTHESIS EXAMPLE 6

Synthesis of Polymer A-6 having Carboxyl Groups

| acrylic acid | 72 parts |
| styrene | 650 parts |
| ethyl acrylate | 100 parts |
| n-butyl acrylate | 178 parts |
| AIBN | 75 parts | was polymerized in the same manner as in Preparation Example 4 to obtain a polymer A-6. Solid content=about 62.5%; carboxyl group content=1 equivalent/kg of polymer; aromatic ring content=45 parts by weight/100 parts by weight of polymer.

SYNTHESIS EXAMPLE 7

Synthesis of Polymer A-7 having Hydroxyphenyl Groups

Into a flask were placed 1,490 parts of o-cresol, 1,145 parts of 30% formalin, 130 parts of deionized water and 6.5 parts of oxalic acid. The mixture was refluxed by heating for 60 minutes. Thereto was added 13.5 parts of 15% hydrochloric acid. The mixture was refluxed by heating for 40 minutes. Thereto was added 400 parts of deionized water of about 15° C. The contents in the flask were kept at about 75° C. to precipitate a resin. Thereto was added a 35% aqueous sodium hydroxide solution for neutralization. Then the aqueous layer was removed. To the resin layer was added 400 parts of deionized water to wash the resin at 75° C. The aqueous layer was removed. The washing operation was repeated twice. The resin was dried at about 120° C. under reduced pressure to obtain a novolac phenolic resin (polymer A-7). Molecular weight=about 600; hydroxyphenyl group content=9.4 equivallents/kg of polymer.

SYNTHESIS EXAMPLE 8

Synthesis of Polymer A-8 having Hydroxyphenyl Groups

Into a flask were placed 60 parts of tetrahydrofuran, 21 parts of p-hydroxystyrene, 9 parts of n-butyl acrylate and 3 parts of azobisisobutyronitrile. The gas inside the flask was replaced by nitrogen, and the flask contents were heated at 100° C. for 2 hours with stirring. The reaction mixture was poured into 700 ml of toluene. The resulting precipitate was separated and dissolved in 100 ml of acetone. The solution was poured into 700 ml of toluene again. The resulting precipitate was dried at 60° C. under reduced pressure to obtain a polymer A-8. Molecular weight=about 14,000; n-butyl acrylate/p-hydroxystyrene=35/65 (weight ratio); hydroxyphenyl group content=5.3 equivalents/kg of polymer.

SYNTHESIS EXAMPLE 9

Synthesis of Vinyl Ether Compound B-1

Into a 250-ml flask were placed 45.6 g of bisphenol A, 80 ml of 2-chloroethyl vinyl ether and 100 ml of toluene. The gas inside the flask was replaced by nitrogen. 20 g of sodium hydroxide was added. The mixture was heated at 80° C. for 30 minutes. Then, there was added a solution of 4.56 g of tetrabutylammonium bromide dissolved in 20 ml of 2-chloroethyl vinyl ether. The mixture was heated at 95° C. for 5 hours for a reaction. The reaction mixture was washed with deionized water three times. The organic layer was separated and subjected to distillation to remove unreacted 2-chloroethyl vinyl ether and toluene to obtain a vinyl ether compound B-1. This compound had two vinyl ether groups in the molecule.

SYNTHESIS EXAMPLE 10

Synthesis of Vinyl Ether Compound B-2

Into a flask were placed 1,490 parts of o-cresol, 1,145 parts of 30% formalin, 130 parts of deionized water and 6.5 parts of oxalic acid. The mixture was refluxed by heating for 60 minutes. Thereto was added 13.5 parts of 15% hydrochloric acid. The mixture was refluxed by heating for 40 minutes. Thereto was added 400 parts of deionized water of about 15° C. The contents in the flask were kept at about 75° C. to precipitate a resin. Thereto was added a 35% aqueous sodium hydroxide solution for neutralization. Then the aqueous layer was removed. To the resin layer was added 400 parts of deionized water to wash the resin at 75° C. The aqueous layer was removed. The washing operation was repeated twice. The resin was dried at about 120° C. under reduced pressure to obtain a novolac phenolic resin. Molecular weight=about 600.

The operation of Sythesis Example 9 was repeated except that 45.6 parts of bisphenol A was replaced by 15 parts of said resin, to obtain a vinyl ether compound B-2. This compound had about three and half vinyl ether groups in the molecule.

SYNTHESIS EXAMPLE 11

Synthesis of Vinyl Ether Compound B-3

875 parts of a 75% ethylene glycol dimethyl ether solution of a polyisocyanate obtained by reacting 1 mole of trimethylolpropane with 3 moles of tolylene diisocyanate was reacted with 264 parts of 2-hydroxyethyl vinyl ether in the presence of 1 part of dibutyltin diacetate at 35° C. for 3 hours to obtain a vinyl ether compound B-3. This compound had three vinyl groups in the molecule. Solid content=about 81%.

Example 1

| | |
|---|---|
| Polymer A-1 | 100 parts |
| Vinyl ether compound B-1 | 60 parts |
| Polyethylene glycol (average molecular weight: 400) | 2 parts |
| Photochemically-acid-generating compound C-1 (*1) | 10 parts |
| Sensitizing dye-1 (*2) | 0.5 parts |
| Triethylamine | 6 parts | was dissolved in 140 parts of diethylerie glycol dimethyl ether and gradually added to 1,460 parts of deionized water while stirring to obtain an aqueous dispersion having a solid content of about 10%.

In an electrodeposition bath consisting of said aqueous dispersion was dipped a substrate made of polyimide film on which a copper foil of 18 $\mu$m thick was laminated. This copper-laminated substrate was used as an anode and direct current at a current density of 50 mA/dm$^2$ was applied between the anode and the opposite electrode for 1 minute. Thereafter, the substrate was taken out of the bath and water-washed and dried at 120° C. for 8 minutes. The film thickness of the resulting film was 3.4 $\mu$m.

The thus obtained substrate was irradiated with a visible light of 488 nm wavelength with the exposure being changed gradiently, and then was heated at 130° C. for 10 minutes. The substrate after irradiation and heating was developed with 2.38% aqueous solution of tetramethylammonium hydroxide.

The $\gamma$ value (*3) determined from the curve of yield of residual film after development to exposure of visible light was 11.0. There was neither decrease nor swelling of the unirradiated film portions at all.

A film was formed on a substrate made in the same manner and irradiated with a visible light of 488 nm at the exposure of 7 mJ/cm$^2$, through a pattern mask, and then dipped in water at normal temperature for 1 minute. After that the irradiated film was subjected to the same treatment as above, to form an image pattern of line/space=1/1 $\mu$m. The sectional shape of the image pattern was evaluated by the angle formed by the substrate surface and the wall surface of the image pattern. The angle was 88°, which indicated a very excellent pattern shape. The lowest exposure for image formation was 5 mJ/cm$^2$.

(*1) Photochemically-acid-generating compound C-1: NAI-100 made by Midori Chemical, represented by the following formula, was used.

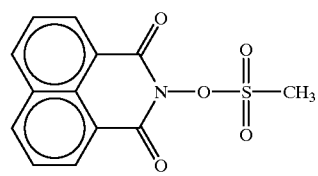

(*2) Sensitizing dye-1: NKX-1595 made by Nippon Kanko Shikiso Kenkyusho, represented by the following formula, was used.

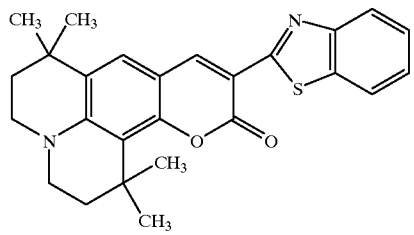

(*3) γ value: An index showing a contrast level. A higher γ value shows higher contrast. The measurement of γ value was conducted by the method described in "Photopolymer Handbook" pp. 101–103 (1989), edited by Photopolymer Conference and published by Kogyo Chosakai (Tokyo).

Example 2

| Polymer A-2 | 100 parts |
| Vinyl ether compound B-2 | 25 parts |
| Polyethylene glycol (average molecular weight: 400) | 2 parts |
| Photochemically-acid-generating compound C-2 (*4) | 7.5 parts |
| Sensitizing dye-2 (*5) | 1 part |
| Triethylamine | 6 parts | was dissolved in a mixture of 150 parts of 2-butoxy-ethanol and 25 parts of benzyl alcohol and added to 547 parts of deionized water in the same manner as Example 1 to obtain an aqueous dispersion having a solid content of about 15%. Then, using a transparent electrode substrate made of a glass plate on which indium tin oxide was deposited, electrodeposition coating was conducted in the same manner as Example 1, except that the current density was changed to 20 mA/dm$^2$. Thereafter, the thus treated substrate was dried at 100° C. for 7 minutes. The film thickness obtained was 1.5 μm.

The γ value was determined for this substrate in the same manner as Example 1. The γ value was 10.5 and there was neither decrease nor swelling of the unirradiated film portions at all.

Then, using a visible light of 488 nm as light for irradiation, the shape of the image pattern was evaluated in the same manner as Example 1, except that the exposure was changed to 3 mj/cm$^2$. The angle was 88°, which indicated a very excellent pattern shape. The lowest exposure for image formation was 2 mJ/cm$^2$.

(*4) Photochemically-acid-generating compound C-2: NAI-105 made by Midori Chemical, represented by the following formula, was used.

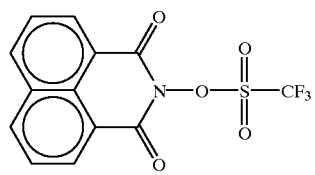

(*5) Sensitizing dye-2: The compound made by Nippon Kanko Shikiso Kenkyusho, represented by the following formula, was used.

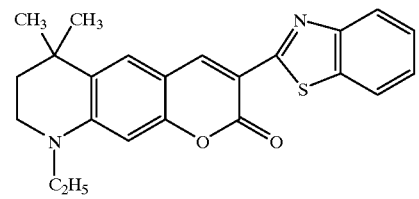

Example 3

| Polymer A-3 | 100 parts |
| Vinyl ether compound B-3 (solid content: 81%) | 20 parts |
| Photochemically-acid-generating compound C-3 (*6) | 5 parts |
| Sensitizing dye-3 (*7) | 1 part |
| Triethylamine | 6 parts | was dissolved in a mixture of 100 parts of dimethoxydiethylene glycol and 50 parts of benzyl alcohol and dispersed in 525 parts of deionized water in the same manner as Example 1 to obtain an aqueous dispersion having a solid content of about 15%.

In an electrodeposition bath consisting of said aqueous dispersion was dipped a copper foil of 300 μm thick as an anode and direct current at 65V was applied between the anode and the opposite electrode for 1 minute. Thereafter, the substrate was taken out of the bath and water-washed and dried at 110° C. for 10 minutes. The film thickness obtained was 4.5 μm.

The γ value of the thus obtained substrate was determined exactly in the same manner as Example 1. The γ value was 10.0.

Then on the resist film on the substrate prepared in the same manner, a pattern of line/space=30/30 μm was drawn by a direct-drawing machine using argon ion laser of 488 nm wavelength at an energy density of 2 mJ/cm$^2$. Then after heating at 130° C. for 10 minutes, it was developed with 3% aqueous solution of sodium carbonate. After that, by etching the exposed copper with copper chloride and by eliminating the film on the substrate with 3% aqueous solution of sodium hydroxide, an excellent etching pattern was formed on the substrate.

(*6) Photochemically-acid-generating compound C-3: NAI-101 made by Midori Chemical, represented by the following formula, was used.

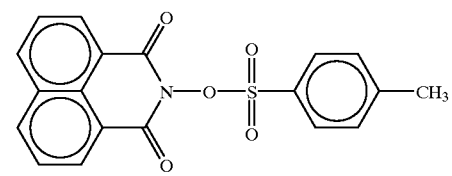

(*7) Sensitizing dye-3: LS-5 made by Mitsui-Toatsu Chemicals, represented by the following formula, was used.

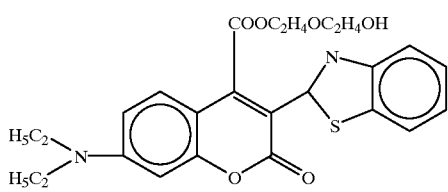

Example 4

| | |
|---|---|
| Polymer A-4 (solid content: 62.5%) | 160 parts |
| Vinyl ether compound B-1 | 70 parts |
| Polyethylene glycol (average molecular weight: 400) | 2 parts |
| Photochemically-acid-generating compound C-1 (*1) | 10 parts |
| Sensitizing dye-1 (*2) | 1 part |
| Triethylamine | 15 parts | was dissolved in 250 parts of diethylene glycol dimethyl ether and gradually added to 695 parts of deionized water while stirring to obtain an aqueous dispersion having a solid content of about 10%.

Then, electrodeposition coating was conducted in the same manner as Example 1 to obtain a substrate, using an electrodeposition bath consisting of said aqueous dispersion.

This substrate was irradiated with a visible light of 488 nm wavelength with the exposure being changed gradiently, and then was heated at 130° C. for 10 minutes. The substrate after irradiation and heating was developed with 2.38% aqueous solution of tetramethylammonium hydroxide.

The γ value determined from the curve of yield of residual film after development to exposure of visible light was 10.0. There was neither decrease nor swelling of the unirradiated film portions at all.

A film was formed on a substrate made in the same manner and irradiated with a visible light of 488 nm at the exposure of 8 mJ/cm$^2$, through a pattern mask, and then dipped in water at normal temperature for 1 minute. After that the irradiated film was subjected to the same treatment as above, to form an image pattern of line/space=2/2 μm. The sectional shape of the image pattern was evaluated by the angle formed by the substrate surface and the wall surface of the image pattern. The angle was 87°, which indicated a very excellent pattern shape. The lowest exposure for image formation was 6 mJ/cm$^2$.

Example 5

| | |
|---|---|
| Polymer A-5 (solid content: 50%) | 200 parts |
| Polymer A-7 | 100 parts |
| Vinyl ether compound B-2 | 100 parts |
| Polyethylene glycol (average molecular weight: 400) | 2 parts |
| Photochemically-acid-generating compound C-2 (*4) | 7.5 parts |
| Sensitizing dye-2 (*5) | 1 part |
| Triethylamine | 15 parts | was treated in the same manner as Example 1 to prepare an aqueous dispersion having a solid content of about 10%. By using an electrodeposition bath consisting thereof, electrodeposition coating was conducted in the same manner as Example 1 to obtain a substrate with a resist film of 3.5 μm thick.

The γ value was determined for this substrate in the same manner as Example 1. The γ value was 11.0 and there was neither decrease nor swelling of the unirradiated film portions at all.

Then the shape of the image pattern on the substrate, which was coated and dried under the above-mentioned conditions, was evaluated using a visible light of 488 nm as the light for irradiation and exactly in the same manner as Example 1, except at an exposure of 2 mJ/cm$^2$. The angle was 88°, which indicated a very excellent pattern shape. The lowest exposure for image formation was 1.5 mJ/cm$^2$.

Example 6

| | |
|---|---|
| Polymer A-6 (solid content: 62.5%) | 112 parts |
| Polymer A-8 | 30 parts |
| Vinyl ether compound B-3 (solid content: 81%) | 15 parts |
| Photochemically-acid-generating compound C-3 (*6) | 5 parts |
| Sensitizing dye-4 (*8) | 1 part |
| Triethylamine | 7 parts | was used to obtain a substrate with a resist film of 3.4 μm thick in the same manner as Example 1.

The γ value of this substrate was determined exactly in the same manner as Example 1. The γ value was 10.0.

Then on the resist film on the substrate prepared in the same manner, a pattern of line/space=30/30 μm was drawn by a direct-drawing machine using argon ion laser of 488 nm wavelength at an energy density of 2 mJ/cm$^2$. Then after heating at 130° C. for 10 minutes, it was developed with 3% aqueous solution of sodium carbonate. After that, by etching the exposed copper with copper chloride and by eliminating the film on the substrate with 3% aqueous solution of sodium hydroxide, an excellent etching pattern was formed on the substrate.

(*8) Sensitizing dye-4: The compound made by Nippon Kanko Shikiso Kenkyusho, represented by the following formula, was used.

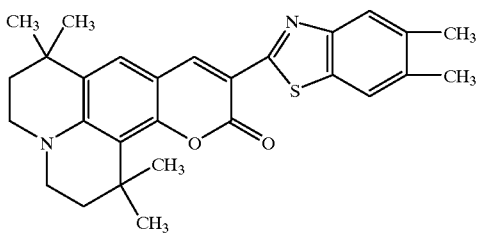

What is claimed is:

1. A positive-type electrodeposition photoresist composition which comprises a solution or dispersion obtained by neutralizing with a basic compound, a composition comprising (A) a polymer having 0.5–10 equivalents of carboxyl group(s) and optionally having more than 1 equivalent of hydroxyphenyl group(s) per kg polymer; (B) a compound having at least two vinyl ether groups per molecule; (C) a compound which generates an acid when irradiated with a visible light, represented by the general formula (1)

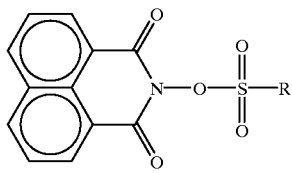

wherein R represents

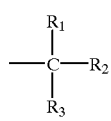

group (where $R_1$, $R_2$ and $R_3$ each independently represent hydrogen atom or fluorine atom),

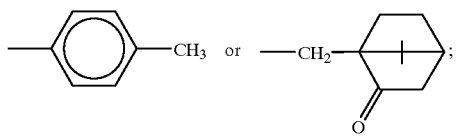

and (D) a sensitizing dye, and dissolving or dispersing the composition in an aqueous medium.

2. The composition set forth in claim 1, wherein the polymer (A) has a number-average molecular weight of about 500 to about 100,000.

3. The composition set forth in claim 1, wherein the polymer (A) has carboxyl group(s) of 0.5–8 equivalents per kg of the polymer.

4. The composition set forth in claim 1, wherein the polymer (A) has hydroxyphenyl group(s) of 1–10 equivalents per kg of the polymer.

5. The composition set forth in claim 1, wherein the polymer (A) has a glass transition temperature (Tg) not lower than 0° C.

6. The composition set forth in claim 1, which contains the vinyl ether group-containing compound (B) in an amount of 5–150 parts by weight per 100 parts per weight of the polymer (A).

7. The composition set forth in claim 1, which contains the photochemically-acid-generating compound (C) in an amount of 0.1–40 parts by weight per 100 parts by weight of the total of the polymer (A) and the vinyl ether group-containing compound (B).

8. The composition set forth in claim 1, which contains the sensitizing dye (D) in an amount of 0.1–10 parts by weight per 100 parts by weight of the total of the polymer (A) and the vinyl ether group-containing compound (B).

9. A positive-type electrodeposition photoresist composition which comprises a solution or dispersion obtained by neutralizing with a basic compound, a composition comprising (A') a polymer having 0.5–10 equivalents of carboxyl group(s) per kg polymer; (A") a polymer having more than 1 equivalent of hydroxyphenyl group(s) per kg polymer; (B) a compound having at least two vinyl ether groups per molecule; (C) a compound which generates an acid when irradiated with a visible light, represented by the general formula (1)

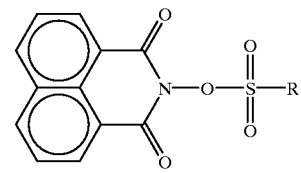

wherein R represents

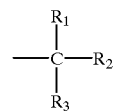

group (where $R_1$, $R_2$ and $R_3$ each independently represent hydrogen atom or fluorine atom),

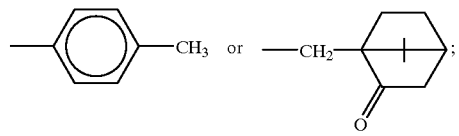

and (D) a sensitizing dye, and dissolving or dispersing the composition in an aqueous medium.

10. The composition set forth in claim 9, wherein the polymer (A') has a number-average molecular weight of about 3,000 to about 100,000.

11. The composition set forth in claim 9, wherein the polymer (A') has carboxyl group(s) of 0.5–8 equivalents per kg of the polymer.

12. The composition set forth in claim 9, wherein the polymer (A") has a number-average molecular weight of about 500 to about 100,000.

13. The composition set forth in claim 9, wherein the polymer (A") has hydroxyphenyl group(s) of 1–10 equivalents per kg of the polymer.

14. The composition set forth in claim 9, wherein each of the polymers (A') and (A") has a glass transition temperature (Tg) not lower than 0° C.

15. The composition set forth in claim 9, wherein the proportion by weight of the polymer (A') and the polymer (A") is 90/10–10/90.

16. The composition set forth in claim 9, which contains the vinyl ether group-containing compound (B) in an amount of 5–150 parts by weight per 100 parts by weight of the total of the polymer (A') and the polymer (A").

17. The composition set forth in claim 9, which contains the photochemically-acid-generating compound (C) in an amount of 0.1–40 parts by weight per 100 parts by weight of the total of the polymer (A'), the polymer (A") and the vinyl ether group-containing compound (B).

18. The composition set forth in claim 9, which contains the sensitizing dye (D) in an amount of 0.1–10 parts by weight per 100 parts by weight of the total of the polymer (A'), the polymer (A") and the vinyl ether group-containing compound (B).

19. The composition set forth in claim 1 or claim 9, wherein the vinyl ether group-containing compound (B) is a low-molecular weight or high-molecular weight compound having, in the molecule, two to four vinyl ether groups represented by a formula —R'—O—CH=CH₂, wherein R' represents a C₁–C₆ straight chain or branched chain alkylene group.

20. The composition set forth in claim 1 or claim 9, wherein the vinyl ether group-containing compound (B) is a condensation product between a polyphenol compound and a halogenated alkyl vinyl ether, or a reaction product between a polyisocyanate compound having an aromatic ring and a hydroxyalkyl vinyl ether.

21. The composition set forth in claim 1 or claim 9, wherein the photochemically-acid-generating compound (C) is selected from the group consisting of

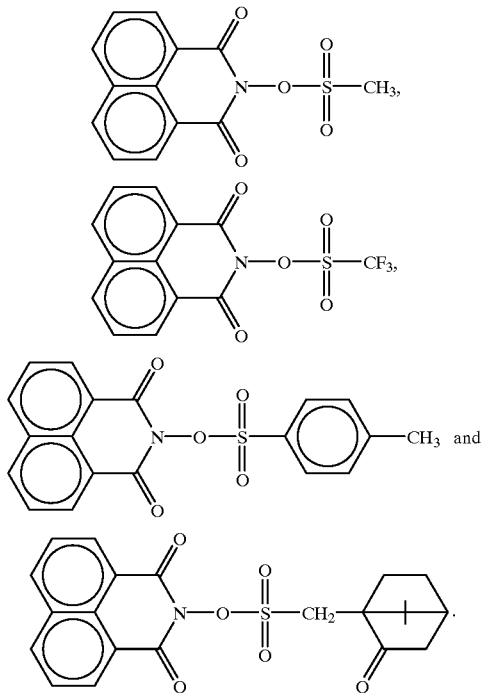

22. The composition set forth in claim 1 or claim 9, wherein the sensitizing dye (D) is selected from the group consisting of compounds represented by general formulae

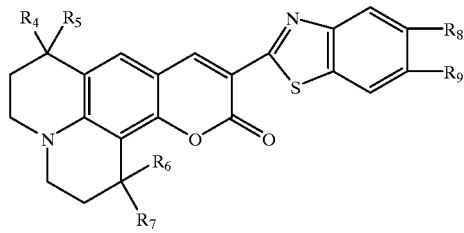

wherein $R_4$, $R_5$, $R_6$ and $R_7$ each independently represents methyl, ethyl, propyl or isopropyl groups, and $R_8$ and $R_9$ each independently represents hydrogen atom, alkyl group of 1–4 carbon atoms, alkoxy group of 1–4 carbon atoms, alkoxycarbonyl group of 2–5 carbon atoms, dialkylamino group of 1–4 carbon atoms in each alkyl moiety, Cl, Br, CN, NO₂ or SO₂CH₃; and

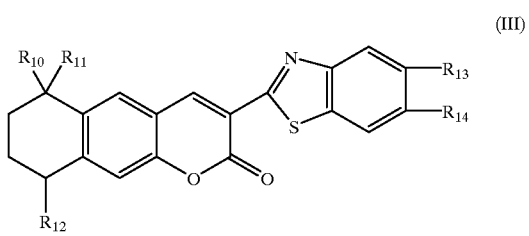

wherein $R_{10}$, $R_{11}$ and $R_{12}$ each independently represents methyl, ethyl, propyl or isopropyl groups, and $R_{13}$ and $R_{14}$ each independently represents hydrogen atom, alkyl group of 1–4 carbon atoms, alkoxy group of 1–4 carbon atoms, alkoxycarbonyl group of 2–5 carbon atoms, dialkylamino group of 1–4 carbon atoms in each alkyl moiety, Cl, Br, CN, NO₂ or SO₂CH₃; cyanine dyes, merocyanine dyes and coumarin dyes.

23. The composition set forth in claim 1 or claim 9, which further contains hydrophilic resins.

24. The composition set forth in claim 1 or claim 9 wherein the composition is neutralized with a basic compound in an amount of 0.1–1 equivalent per carboxyl group in the polymer (A) or (A').

25. A process for pattern formation which comprises conducting sequentially: a step of coating a positive type electrodeposition photoresist composition as set forth in claim 1 or claim 9 on a substrate having an electroconductive surface by electrodeposition; a step of heating said substrate; a step of irradiating the resulting substrate image-selectively with a visible light; a step of heating the irradiated substrate, and a step of subjecting the resulting substrate to development with a basic developer.

26. The process for pattern formation set forth in claim 25, which further comprises a step of contacting the substrate with water, after the step of irradiating the substrate image-selectively with a visible light.

27. A pattern which is formed by the process set forth in claim 25.

28. A pattern which is formed by the process set forth in claim 26.

* * * * *